US008478551B2

(12) United States Patent
Comery

(10) Patent No.: US 8,478,551 B2
(45) Date of Patent: Jul. 2, 2013

(54) SYSTEMS AND METHODS OF PROFILING POWER CYCLES IN A BATTERY FOR INDICATING DETRIMENTAL BATTERY OPERATION

(75) Inventor: David A. Comery, Buford, GA (US)

(73) Assignee: Cisco Technology, Inc., San Jose, CA (US)

( * ) Notice: Subject to any disclaimer, the term of this patent is extended or adjusted under 35 U.S.C. 154(b) by 805 days.

(21) Appl. No.: 12/178,791

(22) Filed: Jul. 24, 2008

(65) Prior Publication Data
US 2008/0288194 A1 Nov. 20, 2008

Related U.S. Application Data

(63) Continuation of application No. 11/428,348, filed on Jun. 30, 2006, now Pat. No. 7,504,801.

(51) Int. Cl.
*G01R 31/36* (2006.01)
*G01R 21/00* (2006.01)
*G01R 15/00* (2006.01)
*H02J 7/00* (2006.01)

(52) U.S. Cl.
USPC .............. 702/63; 702/60; 702/57; 320/107

(58) Field of Classification Search
USPC ..... 702/57, 58, 60, 63, 81, 189; 320/127–136, 320/160; 324/426, 432
See application file for complete search history.

(56) References Cited

U.S. PATENT DOCUMENTS

| 4,731,814 | A | 3/1988 | Becker et al. | |
|---|---|---|---|---|
| 4,743,831 | A | 5/1988 | Young | |
| 5,600,230 | A | 2/1997 | Dunstan | |
| 5,659,240 | A | 8/1997 | King | |
| 5,825,156 | A * | 10/1998 | Patillon et al. | 702/63 |
| 6,433,513 | B1 | 8/2002 | Hayashi | |
| 6,470,290 | B1 * | 10/2002 | Lee et al. | 702/132 |
| 7,504,801 | B2 * | 3/2009 | Comery | 320/107 |
| 7,528,574 | B1 * | 5/2009 | Adkins et al. | 320/128 |
| 7,576,517 | B1 * | 8/2009 | Cotton et al. | 320/136 |
| 2005/0038614 | A1 * | 2/2005 | Botts et al. | 702/63 |

FOREIGN PATENT DOCUMENTS

| CA | 2 655611 | 1/2008 |
|---|---|---|
| EP | 2036187 A2 | 3/2009 |
| JP | 07201370 | 8/1995 |
| WO | WO2008/005790 | 1/2008 |

OTHER PUBLICATIONS

PCT International Search Report mailed Dec. 17, 2007 for PCT/US2007/072330; 3pgs.
PCT International Preliminary Report on Patentability and Written Opinion of the International Searching Authority mailed Jan. 6, 2009 for PCT/US2007/072330; 8 pages.
EPO Communication regarding EP Application 07812415.3 (published as EP2036187A2) mailed Mar. 2, 2011; 7 pages.

* cited by examiner

*Primary Examiner* — Michael Nghiem
*Assistant Examiner* — Ricky Ngon
(74) *Attorney, Agent, or Firm* — Patent Capital Group

(57) ABSTRACT

Systems and methods for profiling power cycle characteristics in a device powered at least by a battery are disclosed. In one embodiment, the method comprises the steps of: detecting a series of power cycle events, examining the series of power cycle events for at least one indication of reduced life of the battery; storing the indication; and notifying a user of the device about the indication. Each power cycle event indicates a transition between line power and battery power.

12 Claims, 11 Drawing Sheets

| POWER CYCLE PROFILE 900C | |
|---|---|
| NAME 910C "TOTAL-ERROR" | |
| SEVERITY 950B= ERROR | |
| | ATTRIB. 930C3 ="NUMTRANSITIONS" |
| | THRESHOLD 940C3 = 400 |

| POWER CYCLE PROFILE 900B | |
|---|---|
| NAME 910B "NIGHTLY-WARNING" | |
| SEVERITY 950B= ERROR | |
| | ATTRIB. 930B1 ="FREQ. AVG" |
| | THRESHOLD 930B1 = 24 |
| | ATTRIB. 930B3 ="NUMTRANSITIONS" |
| | THRESHOLD 940B3 = 6 |
| | ATTRIB. 930B4 ="AVG DURATION" |
| | THRESHOLD 940B4 = 9 |

| POWER CYCLE PROFILE 900A | |
|---|---|
| NAME 910A "NIGHTLY-ERROR" | |
| SEVERITY 950A= WARNING | |
| | ATTRIB. 930A1 ="FREQ. AVG" |
| | THRESHOLD 930A1 = 24 |
| | ATTRIB. 930A2 =FREQ. VARIATION |
| | THRESHOLD 940A2 = 2 |
| | ATTRIB. 930A3 ="NUMTRANSITIONS" |
| | THRESHOLD 940A3 = 10 |
| | ATTRIB. 930A4 ="AVG DURATION" |
| | THRESHOLD 940A4 = 9 |

| POWER CYCLE CHARACTERISTICS 400 | |
|---|---|
| FREQ AVG 420 | = 22 |
| FREQ VAR. 430 | = 1.3 |
| TRANSITIONS 340 | = 10 |
| AVG DURATION 350 | = 9.4 |

FIG. 11

SYSTEMS AND METHODS OF PROFILING POWER CYCLES IN A BATTERY FOR INDICATING DETRIMENTAL BATTERY OPERATION

CROSS REFERENCE TO RELATED APPLICATIONS

This application is a continuation application claiming priority and benefit under 35 USC §120 from U.S. patent application Ser. No. 11/428,348, filed Jun. 30, 2006, now U.S. Pat. No. 7,504,801 B2.

FIELD OF THE DISCLOSURE

The present disclosure relates to electronic devices, and more specifically, to systems and methods for power management of electronic devices.

BACKGROUND

Some electronics devices are able to operate from either alternating current (AC), also known as line power, or a battery. In such devices, as long as line power is provided, the device operates on line power and recharges the battery. When line power is removed, the device operates on battery power, and the battery discharges until line power is once again provided.

Repeatedly using the battery rather than line power to operate the device reduces the lifetime of the battery, because powering the device from the battery discharges the battery, and battery lifetime is limited to some number of charge/discharge cycles. Sometimes a user removes line power from the device without realizing that doing so will negatively affect the battery lifetime. One example of this situation occurs when line power to the device is used in conjunction with a switch, such as a light switch or the switch on a power strip.

In this configuration, a user may turn off the switch, and thus line power to the device, without realizing the device is affected. During the time that the switch is off, battery-powered devices will deplete their battery charge. This has the effect of reducing battery life if done repeatedly. Another effect is that the device battery will be in a lower state of charge if a true power outage were to occur. This is particularly true for devices which rely on battery operation to deliver a critical service, such as when a device interfaces to the telephone network or an alarm system.

BRIEF DESCRIPTION OF THE DRAWINGS

Many aspects of the disclosure can be better understood with reference to the following drawings. The components in the drawings are not necessarily to scale, emphasis instead being placed upon clearly illustrating the principles of the present disclosure.

FIG. 11 illustrates an example scenario in which power cycle characteristics are compared to three profiles.

DETAILED DESCRIPTION

The embodiments disclosed herein provide systems and methods for profiling power cycles in an electronics device. In one such embodiment, a series of power cycles in the device is detected. The series of power cycles is characterized and described in terms of attributes such as the frequency of transitions to battery, the total number of transitions, and the duration of the battery power interval between transitions. The power cycle characteristics are analyzed to determine if the characteristics indicate detrimental battery operation in the device. For example, a transition to battery power approximately every 24 hours may be found to indicate a situation that reduces battery life. If such an indication is found, the indication is stored and may be used to notify the user of the device, or a system manager.

One typical result of detrimental battery operation is reduced battery life. Another is an increased likelihood that the battery is in a partially discharged state. Other conditions that are detrimental to the battery's electrical characteristics are also contemplated as being in the scope of detrimental battery operation.

Figure 1:
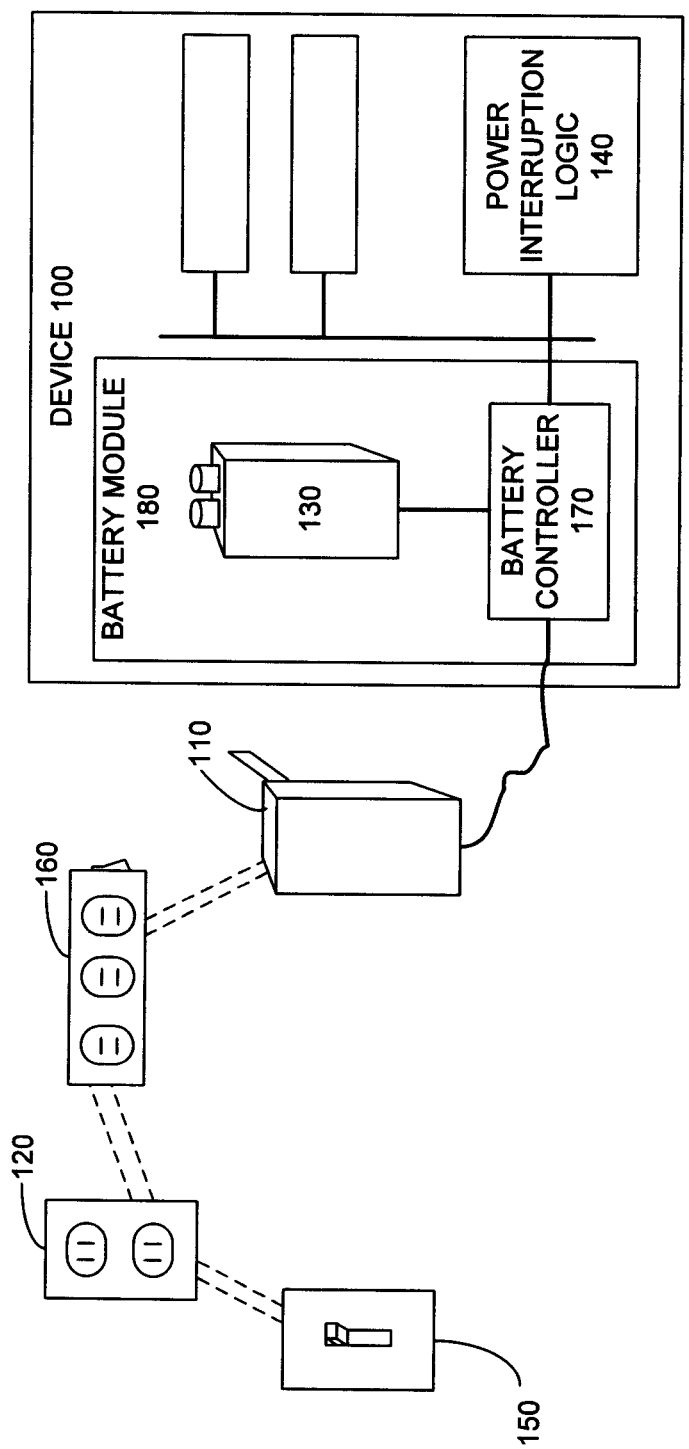
FIG. 1 is a block diagram of an environment in which one embodiment of a system and method for profiling power cycles in an electronics device is located.

FIG. 1 is a block diagram of an environment in which one embodiment of a system and method for profiling power cycles in an electronics device is located. A device 100 is supplied with power by power supply 110, which converts AC power received from outlet 120 to DC power. Device 100 includes a battery 130, which supplies DC power to power interruption logic 140 and other electronic components within device 100 when AC power to power supply 110 is interrupted. This feature is commonly known as "battery backup."

One reason for such an interruption is a user turning off a first switch 150 which optionally controls the AC power being delivered by outlet 120 and the DC power being delivered by power supply 110. Another reason for such an interruption is a user turning off a second switch 160 which optionally controls the DC power being delivered by power supply 110. Other exemplary reasons for power interruption include a blackout on the power distribution grid supplying power to outlet 120, and a user unplugging power supply 110 from outlet 120.

When power flows normally from power supply 110, battery controller logic 170 uses this DC power to charge battery 130. When battery controller logic 170 detects an interruption in power from power supply 110, battery controller logic 170 effects the switchover to battery power. In one implementation, battery controller logic 170 and battery 130 are integrated into a battery module 180.

Figure 2:
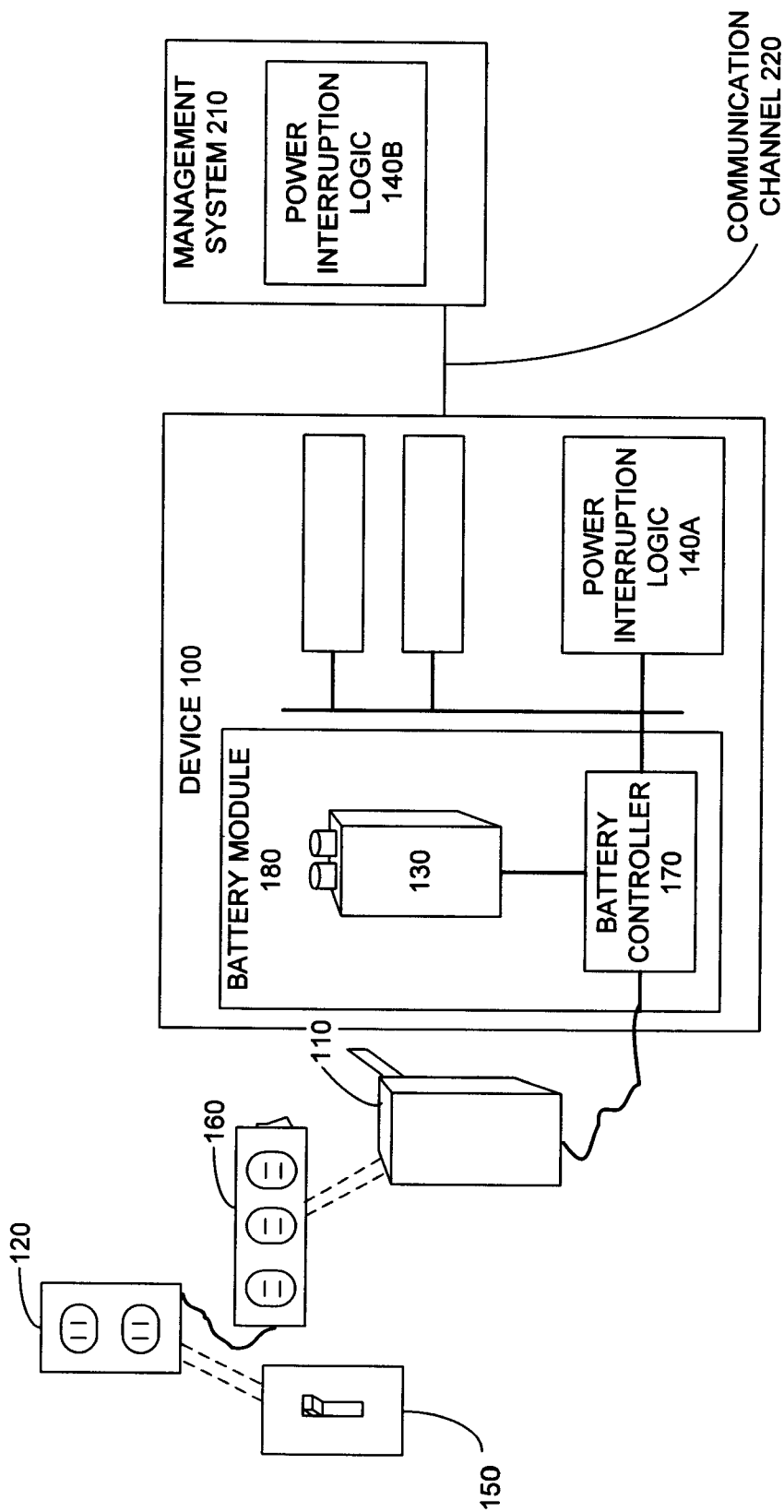
FIG. 2 is a block diagram of an environment in which an alternative embodiment of a system and method for profiling power cycles in an electronics device is located.

FIG. 2 is a block diagram of an environment in which an alternative embodiment of a system and method for profiling power cycles in an electronics device is located. A management system 210 is in communication with device 100 over a communication channel 220. In this embodiment, a portion (140A) of power interruption logic 140 resides in device 100 and another portion (140B) resides in management system 210. In one embodiment, device 100 is a multimedia terminal adapter (MTA) located at a customer premises, management system 210 is located at the headend of a service operator, and communication channel 220 is provided by a physical media, such as a hybrid fiber coax (HFC) cable.

As will be described in further detail below, power interruption logic 140 detects transitions within device 100 between AC power and battery power, and examines these transitions for characteristics which indicate detrimental battery operation such as reduced battery charge. If such characteristics are found, power interruption logic 140 generates, and optionally stores, an error.

Exemplary ways of partitioning power interruption logic 140 between device 100 and management system 210 will be discussed later in connection with FIGS. 5-8. Power interruption logic 140 can be implemented in software, hardware, or a combination thereof. In some embodiments, power interruption logic 140 is implemented in software that is stored in a memory and that is executed by a suitable microprocessor situated in a computing device. In alternative embodiments, the power interruption logic 140 is implemented in hardware, including but not limited to: a discrete logic circuit(s) having logic gates for implementing logic functions upon data signals; a field programmable gate array (FPGA) having appropriate sequential and/or combinatorial logic gates; and an application specific integrated circuit (ASIC) having appropriate sequential and/or combinatorial logic gates. In other embodiments, power interruption logic 140 is implemented by a combination of software and hardware.

Figure 3:
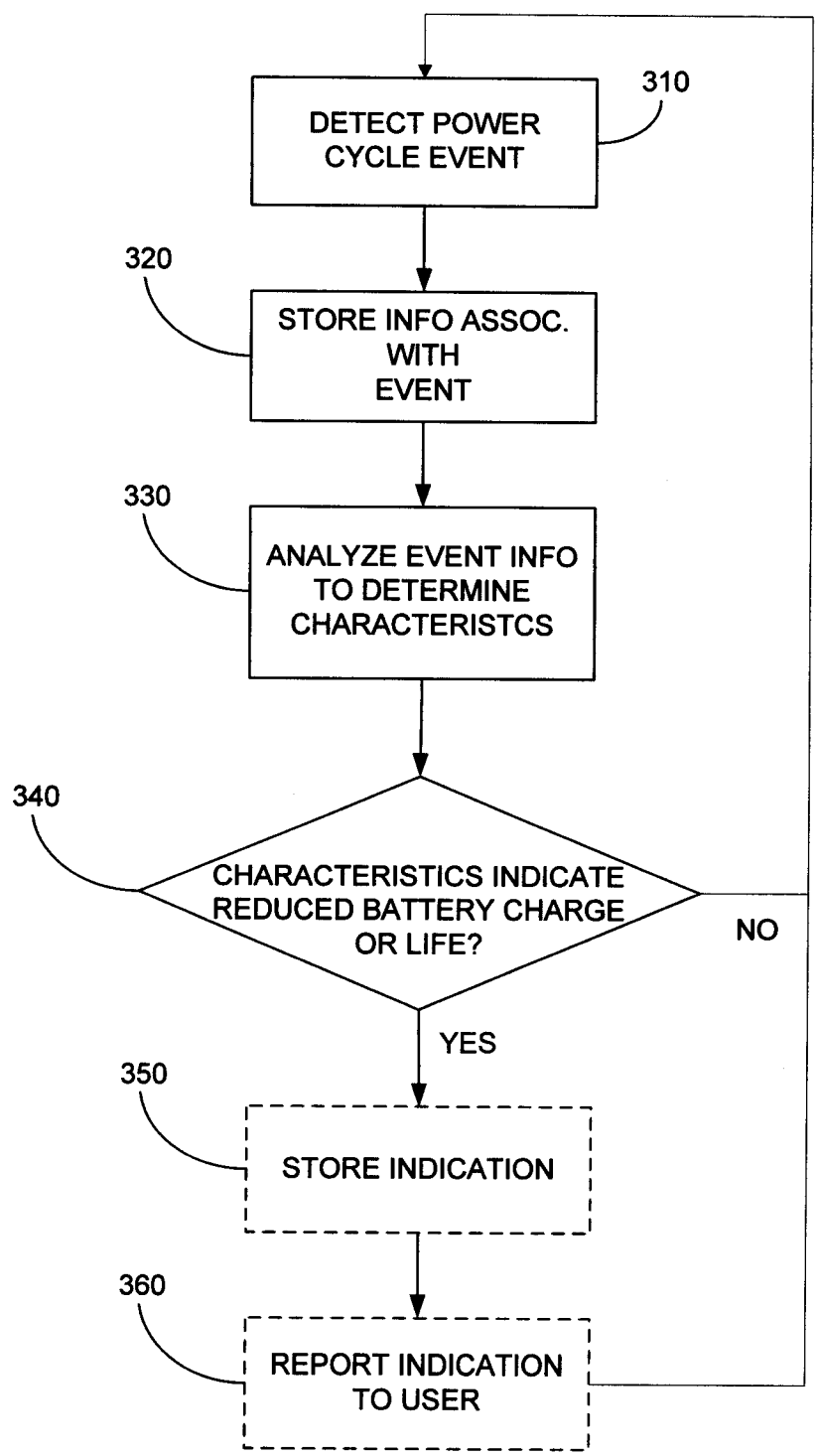
FIG. 3 is a flowchart describing an exemplary method embodied by power interruption logic 140 from FIG. 1.

FIG. 3 is a flowchart describing an exemplary method embodied by power interruption logic 140. The process 300 begins at block 310, which detects a power cycle event. In one implementation, this power cycle event detected through an interrupt mechanism; in another implementation, the event is detected through a polling mechanism. Examples of power cycle events are transitions between AC power and battery power, and battery depletions. One of ordinary skill in the art should understand that the event may be viewed from the standpoint of the battery, or the AC power supply. That is, a transition from AC to battery may be denoted as SWTICH_TO_BATTERY or SWITCH_FROM_AC.

Processing continues at block 320, where information about the power cycle event, such as the occurrence time and event type (for example, AC-to-battery or battery-to-AC), is stored. Next (block 330), the series of stored events is analyzed to determine at least one power cycle characteristic. (Power cycle characteristics will be discussed in more detail in connection with FIG. 4.)

At block 340, the process determines whether the observed power cycle characteristic(s) indicate detrimental operation of battery 130. In one embodiment, this determination is made by comparing the characteristic(s) to a threshold. In another embodiment, this determination is made by comparing the characteristic(s) to multiple thresholds, where a different indication is produced for each threshold. In this manner, different levels of reduced lifespan can be indicated, for example, a Severe or Error indication for one threshold, a Warning indication for another threshold, and an Informational indication for yet another threshold.

If the observed power cycle characteristic(s) does not indicate detrimental battery operation, processing continues at block 310, awaiting detection of another power cycle event. If reduced lifespan is indicated, the indication is optionally stored at block 350, and optionally reported (at block 360) by a visual or audio alert to the user of device 100 (e.g., a warning LED or a beep tone). Other examples of reporting methods will be discussed in connection with FIG. 5. Processing then continues at block 310, awaiting detection of another power cycle event.

Figure 4:
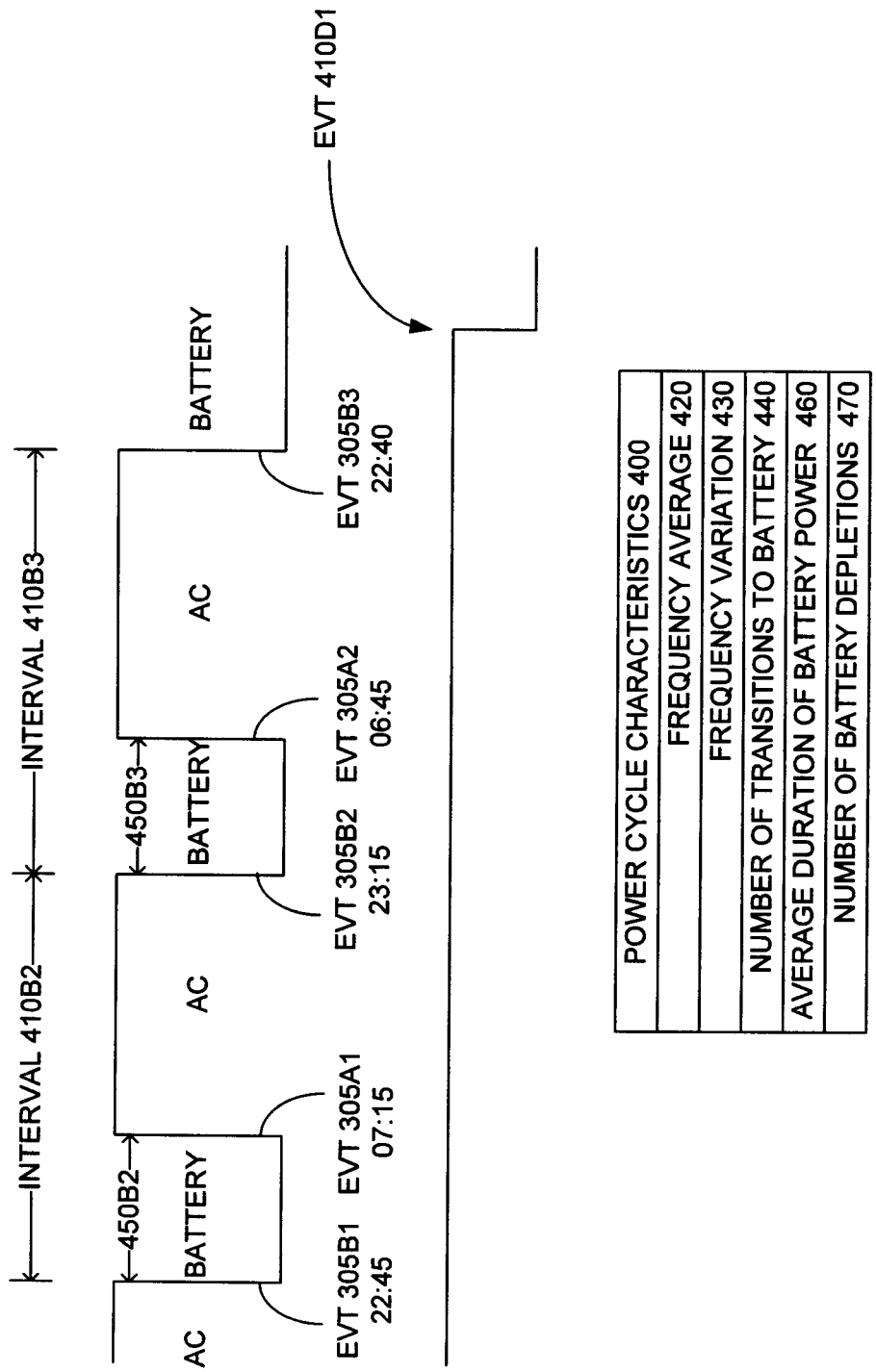
FIG. 4 illustrates how power cycle characteristics are derived from a series of power cycle events in one embodiment of power interruption logic 140 from FIG. 1.

FIG. 4 illustrates how power cycle characteristics 400 are derived from a series of power cycle events in one embodiment of power interruption logic 140. Power cycle events 410A1 and 410A2 represent transitions from battery power to AC power. Events 410B1, 410B2 and 410B3 represent transitions from AC power to battery power. Event 410D1 indicates that the battery has been depleted and the device has entered a powered-off state.

The interval between transitions to battery power is one example characteristic derived from this series of power cycle events 410. Transition interval 420B2 is the interval between transition 410B1 and transition 410B2. Transition 420B3 is the interval between transition 410B2 and transition 410B3.

In one embodiment, an average interval between transitions is calculated as power cycle data is collected. This average interval between power cycle transitions can also be viewed as an average frequency (430) of power cycle transitions, and the term "frequency" will be used hereinafter instead of "interval between."

Yet another characteristic derivable from power cycle events 410 is the variation (440) in frequency of power cycle transitions. Two common methods for calculating variation are standard deviation and variance. Other power cycle characteristics include a total number (450) of transitions to battery power, and a total number of battery depletions (470) which have occurred.

The duration of battery power in between transitions is another example characteristic derived from power cycle events 410. Duration 460B2 is the duration of battery power for the interval between transition 410B1 and transition 410B2. Duration 460B3 is the duration of battery power for the interval between transition 410B2 and transition 410B3. In one embodiment, an average duration of battery power 470 is maintained as power cycle data is collected.

One of ordinary skill in the art should understand that these, and other, power cycle characteristics can be used alone or in any combination by various embodiments of power interruption logic 140.

FIG. 1 illustrated an embodiment in which power interruption logic 140 is located in device 100. FIG. 2 illustrated an embodiment in which power interruption logic 140 is divided between device 100 and management system 210. FIGS. 5-8 are data flow diagrams illustrating how power interruption logic 140 is partitioned between device 100 and management system 210 in four exemplary embodiments.

Figure 5:
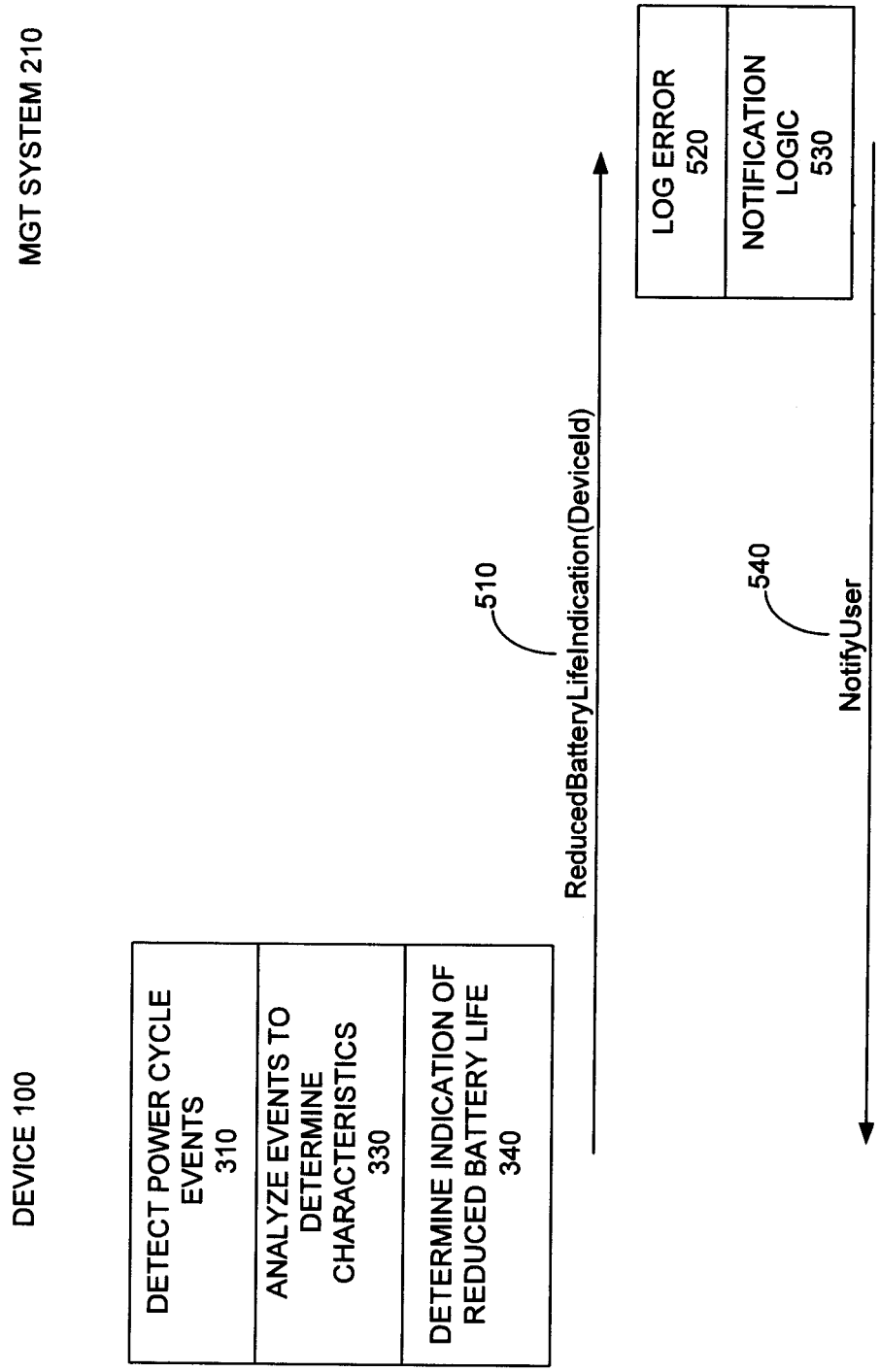
FIG. 5 is a data flow diagram illustrating how power interruption logic 140 (from FIG. 1) is partitioned between a device and a management system in one embodiment.

In the embodiment of FIG. 5, device 100 detects (310) power cycle events, analyzes (330) events to determine power cycle characteristics 400, and determines (340) an indication of detrimental battery operation, based on the characteristics. (These areas of functionality were described earlier in connection with FIG. 3.) Upon determining that power cycle characteristics 400 are an indication of detrimental battery operation, device 100 notifies management system 210 using message 510. Management system 210 logs (520) an error, which may include logging an identifier of device 100, the time the error indication was received, and the type of error indication.

Next, notification logic (530) within management system 210 determines whether the user of device 100 should be notified about the indication of detrimental battery operation, and if so, what mechanism is to be used. For example, some customers may not want to be notified at all, some may prefer email, and others may prefer a phone call. If the notification method involves device 100, management system 210 sends a message (540) to device 100, instructing device 100 to alert the user that detrimental battery operation has been indicated.

One example of notification involving device 100 is when device 100 provides a visual and/or electrical alarm block indicators to the user and activates the visual and/or electrical alarm. Another example is when a case in which device 100 causes an indication to be displayed on the user's television or computer screen.

Figure 6:
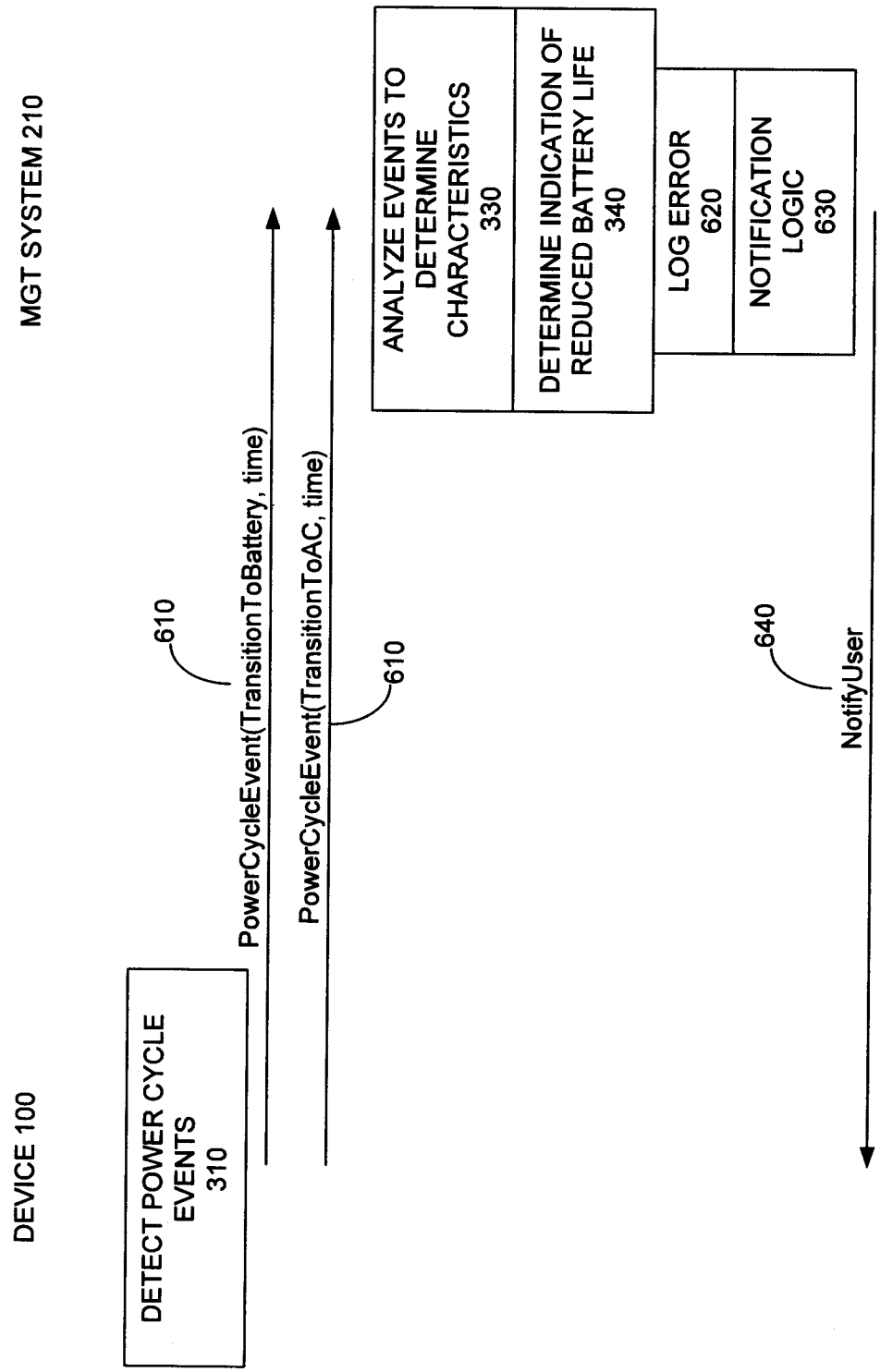
FIG. 6 is a data flow diagram illustrating another partitioning of power interruption logic 140 between a device and a management system.

In the embodiment of FIG. 6, device 100 detects (310) power cycle events and reports the events to management system 210 using message 610. Management system 210 analyzes (330) events to determine power cycle characteristics 400, and determines (340) an indication of detrimental battery operation, based on the characteristics. If detrimental battery operation is indicated, management system 210 logs (620) an error, and notification logic 630 determines whether the user of device 100 should be notified about the indication of detrimental battery operation, and if so, what mechanism is to be used. If the notification method involves device 100, management system 210 sends a message (550) to device 100, instructing device 100 to alert the user that detrimental battery operation has been indicated.

Figure 7:
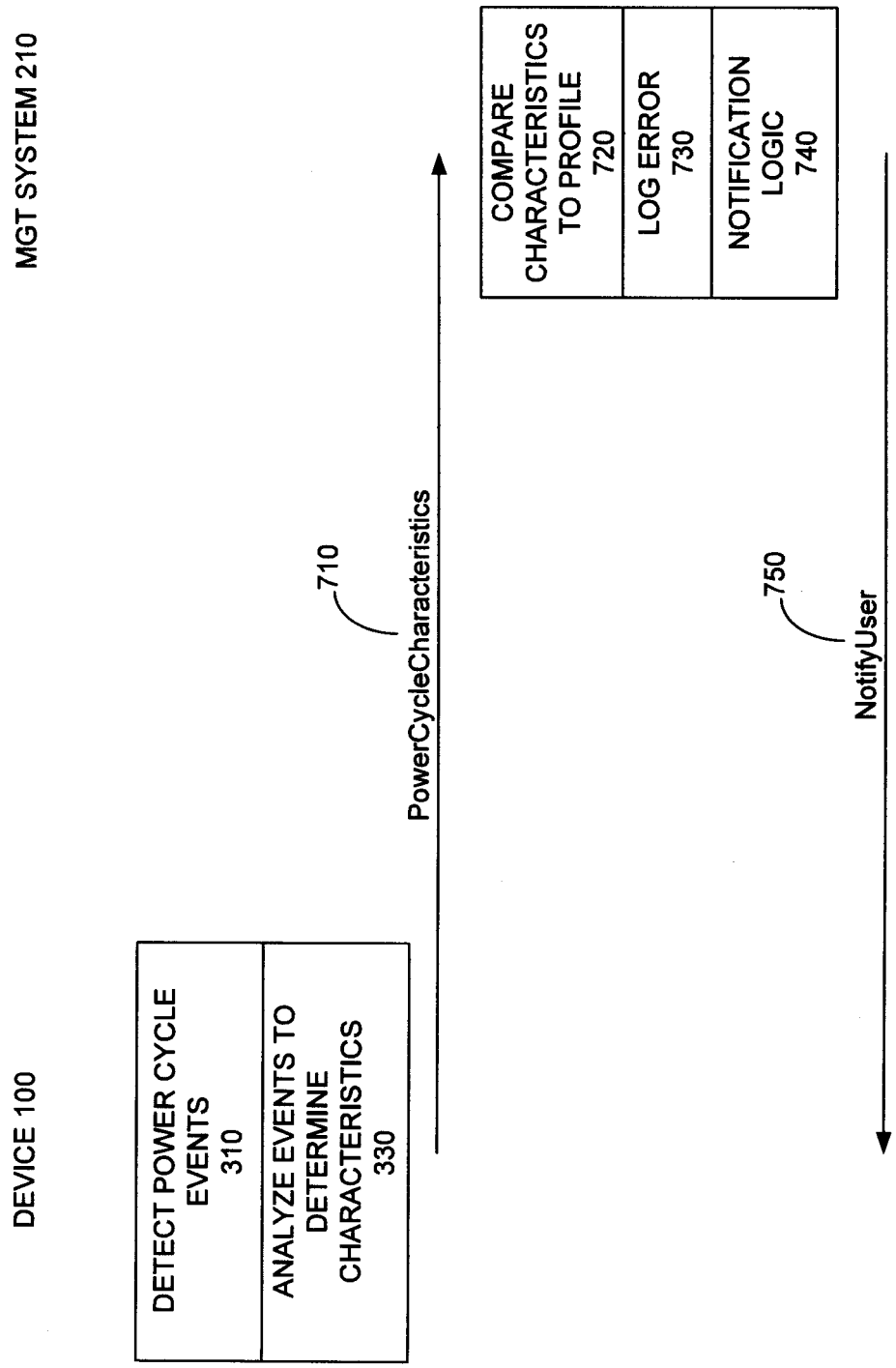
FIG. 7 is a data flow diagram illustrating yet another partitioning of power interruption logic 140 between a device and a management system.
Figure 8:
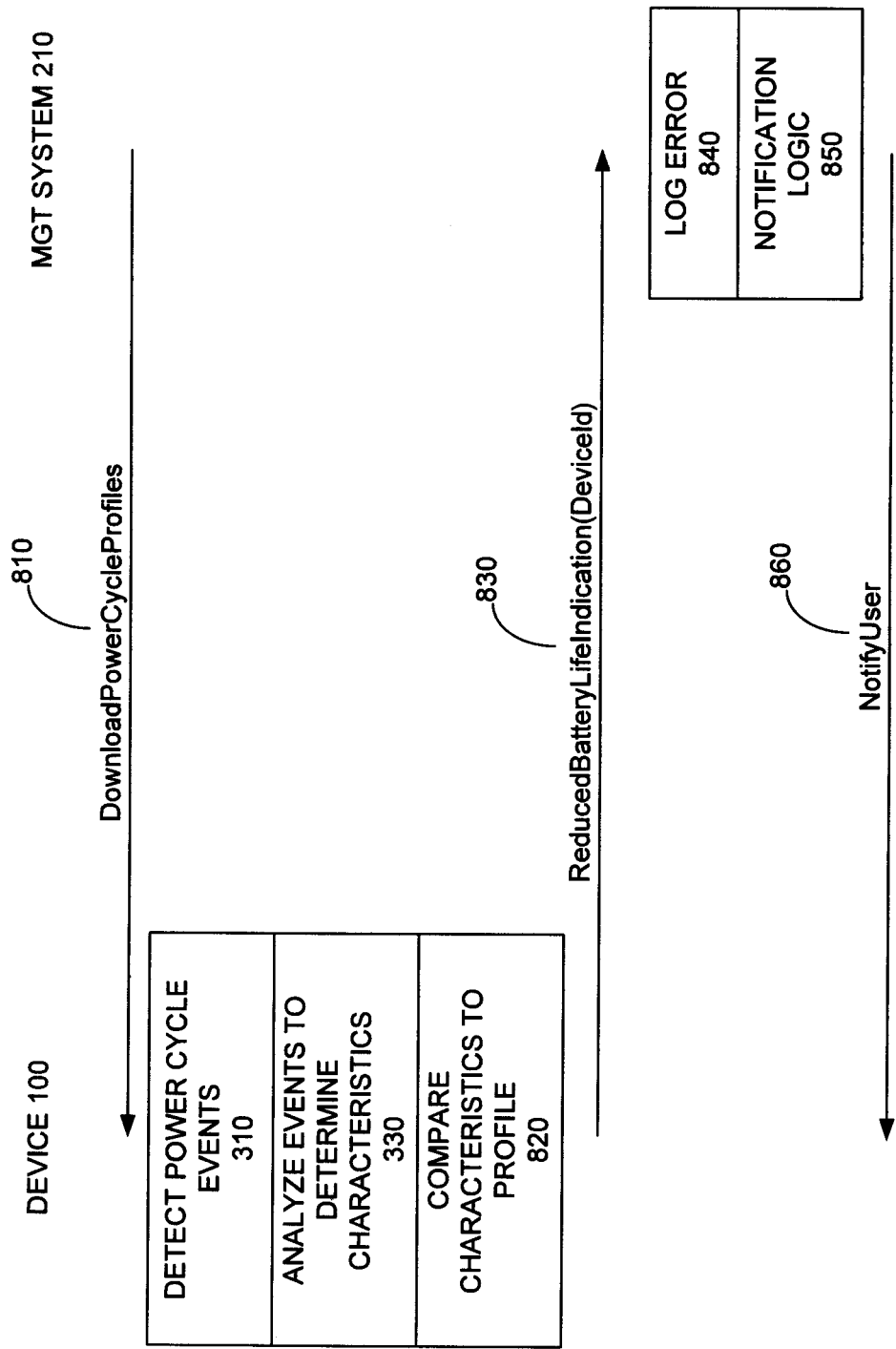
FIG. 8 is a data flow diagram illustrating another partitioning of power interruption logic 140 between a device and a management system.

The embodiments of FIGS. 7 and 8 use power characteristic profiles 900 in determining an indication of detrimental battery operation. A profile 900, which will be discussed in more detail in connection with FIG. 9, describes the characteristics of a series of power cycles, for example, in terms of power cycle frequency and/or battery interval duration. In the embodiment of FIG. 7, profiles 900 reside in management system 210. In the embodiment of FIG. 8, profiles 900 are downloaded to device 100.

In the embodiment of FIG. 7, device 100 detects (310) power cycle events, and analyzes (330) events to determine power cycle characteristics 400. Device 100 communicates the power cycle characteristics 400 to management system 210 through message 710. Management system 210 compares (720) the power cycle characteristics 400 to a set of profiles 900 maintained by management system 210. A matching profile is an indication of detrimental battery operation.

If detrimental battery operation is indicated, management system 210 logs (730) an error, and notification logic 740 determines whether the user of device 100 should be notified about the indication of detrimental battery operation, and if so, what mechanism is to be used. If the notification method involves device 100, management system 210 sends a message (750) to device 100, instructing device 100 to alert the user that detrimental battery operation has been indicated.

In the embodiment of FIG. 8, management system 210 provides one or more profiles 900 to device 100. Once profiles 900 are downloaded, device 100 detects (310) power cycle events, and analyzes (330) events to determine power cycle characteristics 400. In this embodiment, device 100 compares (810) the power cycle characteristics 400 to the set of profiles. A matching profile is an indication of detrimental battery operation, in which case device 100 notifies management system 210 using message 820.

On receipt of message 820, management system 210 logs (830) an error. Next, notification logic (840) within management system 210 determines whether the user of device 100 should be notified about the indication of detrimental battery operation, and if so, what mechanism is to be used. If the notification method involves device 100, management system 210 sends a message (850) to device 100, instructing device 100 to alert the user that detrimental battery operation has been indicated.

In some embodiments, different profiles 900 are used for different types of devices, or for different types of batteries, or for different device/battery combinations. This is useful because batteries differ with regard to power characteristics (e.g., the number of lifetime cycle/discharge cycles, the amount of voltage that constitutes a deep and shallow discharge) and devices differ in battery usage parameters (e.g., how much voltage/current is drawn by the device). In some of these embodiments, these profiles 900 are created by a user of management system 210.

Figure 9:
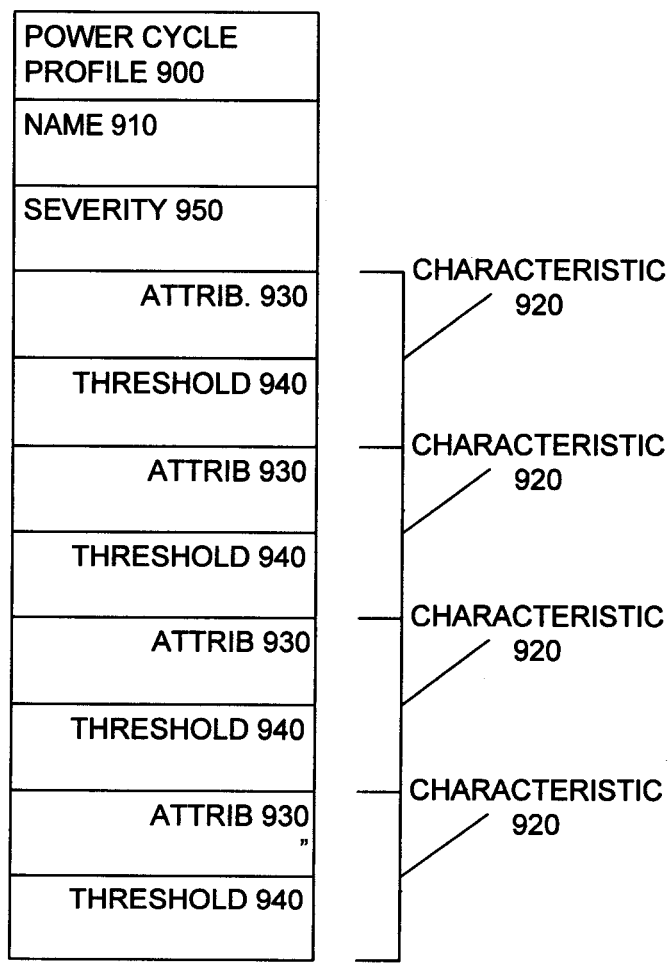
FIG. 9 depicts one example of a power characteristics profile.

The power characteristic profiles 900 used by the embodiments of FIGS. 7 and 8 will now be discussed in further detail in connection with FIGS. 9 and 10. FIG. 9 depicts an exemplary power characteristics profile 900. Profile 900 has a descriptive name 910 and one or more characteristics 920, where a characteristic 920 comprises an attribute 930 and a threshold value 940. Example attributes 930 include an average frequency of transitions to battery, a variation in frequency of transitions to battery, an average interval between transitions to battery, and a total number of transitions to battery. In one embodiment, the threshold value 940 is used in comparing a profile 900 to analyzed power characteristics 400, as will be described later in connection with FIG. 10.

In one embodiment, a profile includes a combinational set of criteria, for example, Characteristic A AND Characteristic B BUT NOT Characteristic C. In another embodiment, a profile includes a sequence of characteristics occurring over time, for example, Characteristic A followed by Characteristic B within C minutes. One of ordinary skill in the art should be able to devise profiles suitable to detect conditions appropriate to the indication of detrimental battery operation.

Also associated with profile 900 is a severity level 950, for example, Informational, Warning and Error. Severity 950 is used in determining whether to notify the user of device 100, and in what manner. In one example embodiment, an indication of detrimental battery operation which has a severity of Error is reported to a user with an intrusive mechanism such as a phone call, an indication which is a Warning Informational is reported with a less intrusive mechanism such as an e-mail message, and a Warning indication is not reported to the user.

Figure 10:
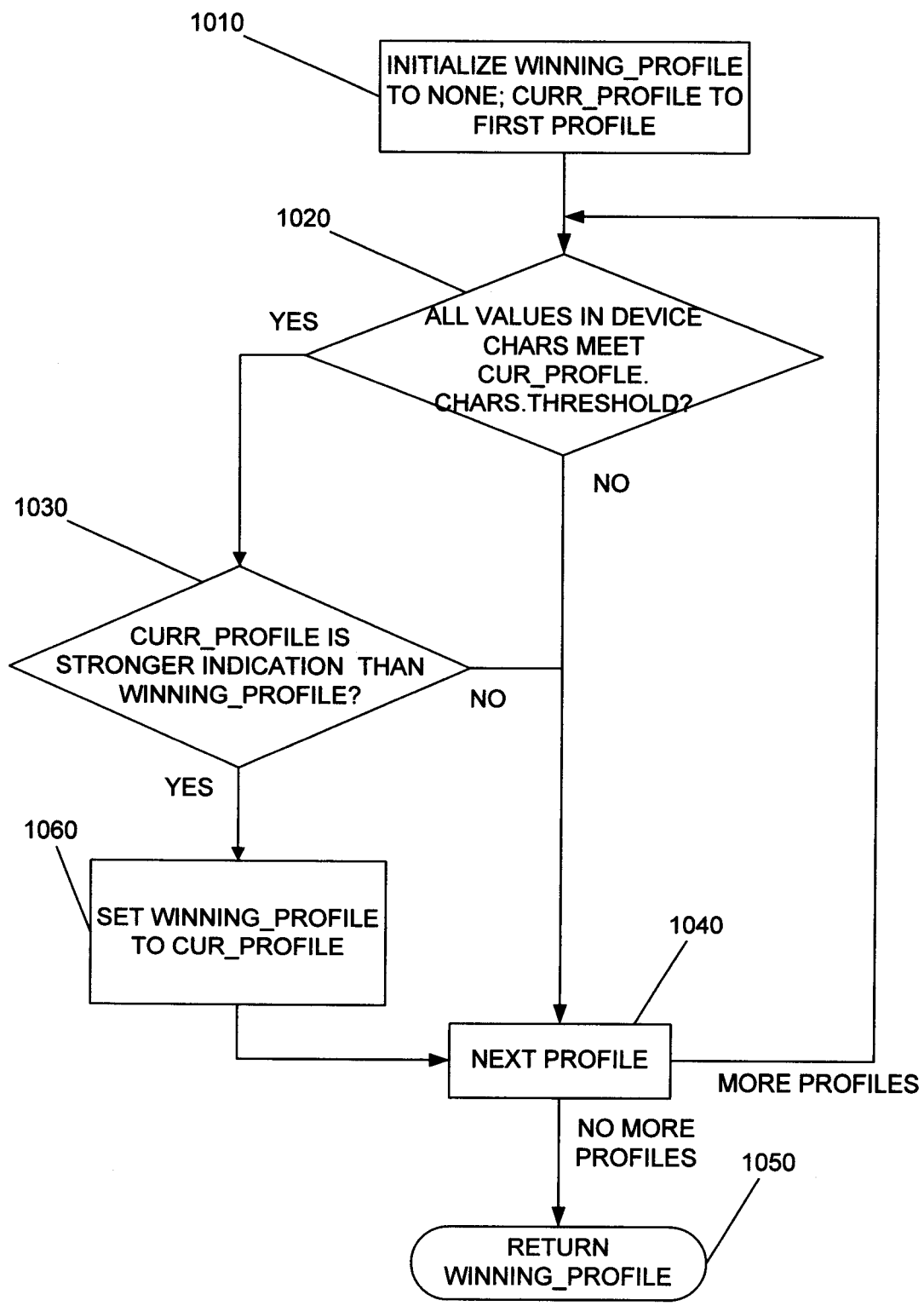
FIG. 10 is a flowchart illustrating a process of comparing power cycle characteristics to one or more profiles, as performed by one embodiment of power interruption logic 140.

FIG. 10 is a flowchart illustrating an exemplary process of comparing power cycle characteristics 400 to one or more profiles 900, in accordance with one embodiment of the systems and methods of profiling power cycles in an electronics device. This process can be used, for example, by the comparison logic 720 and 810 in the embodiments of FIGS. 7 and 8, respectively. The process of FIG. 10 selects a best match, or "winning profile" when more than one profile matches the device power cycle characteristics.

The process begins at block 1010, where the Winning_Profile variable is initialized to None, and the Curr_Profile variable is initialized to the first profile in the set. Next, at block 1020, the power cycle characteristics 400 of the device are compared to characteristics in the current profile. Specifically, the value for each power cycle characteristic (e.g., frequency, duration) is compared to the threshold 940 in the corresponding characteristic 920 of the current profile. If all values in the device characteristics exceed the thresholds in the current profile, then this current profile is a match, and processing continues at block 1030. If all values in the device characteristics do not exceed the current profile thresholds, then this profile is not a match, and the next profile is loaded at block 1040. If another profile exists, processing returns to block 1020. If no more profiles remain, the process exits at block 1050.

Returning to block 1030, a determination is made whether the current profile is a stronger indication of detrimental battery operation than the winning profile. The strength of a profile's indication depends on its threshold values 940. A frequency of 12 hours is a stronger indication than a frequency of 24 hours, since a device that transitions to battery every 12 hours has a shorter battery life than a device that transitions to battery every 24 hours. A battery duration of 8 hours is stronger than a battery duration of 4 hours, since a device that uses battery power for 8 hours between recharges has a shorter battery life than one that uses battery power for 4 hours between recharges.

If the current profile is a stronger indication than the winning profile, then processing continues at block 1060, where the current profile replaces the winning profile. If the current profile is not a stronger indication than the winning profile, then the winning profile remains unchanged. Thus, Winning_ Profile always contains the profile with the strongest indication so far. In either case, the next profile is then loaded at block 1040, and processing returns to block 1020. The process eventually ends at block 1050, after all profiles have been tested for a match, and Winning_Profile contains the best match.

The process of FIG. 10 is illustrated in the example scenario of FIG. 11, which involves a set of device power cycle characteristics 400, and three profiles, 900A, 900B, and 900C. In block 1020 of FIG. 10, values in the power cycle characteristics 400 are compared to corresponding thresholds in the first profile, 900A. In the scenario of FIG. 11, all thresholds are met. Specifically, when frequency average value 430 is compared to frequency average threshold 930A1, the 22 hour value in characteristic 400 meets the 24 hour threshold in profile 900A. When frequency variation value 440 is compared to frequency variation threshold 930A2, the 1.3 hour value in characteristic 400 meets the 2 hour threshold in profile 900A. When number of transitions value 450 is compared to number of transitions threshold 930A3, the 10 count value 450 meets the 10 count threshold 930A3. Finally, when average duration value 470 is compared to average duration threshold 930A4, the 9.4 average duration value 470 meets the average duration threshold 930A4.

Note that two of the characteristics—frequency average and frequency variation—are met when the value is less than the threshold. This is true because a lower frequency of transitions to battery is a stronger indication of detrimental battery operation. In contrast, the other two characteristics— number of transitions and average duration—are met when the value is more than the threshold, because a longer battery duration is a stronger prediction of detrimental battery operation, as is a higher number of transitions to battery.

Continuing with the example scenario of FIG. 11, since power cycle characteristics 400 meets all threshold criteria in the first profile 900A, block 1030 of FIG. 10 is executed. Block 1030 determines whether the current profile is a stronger indication of detrimental battery operation than the winning profile. In this scenario, Winning_Profile is set to None (after being initialized in block 1010). Therefore, block 1060 is executed to make the current profile, 900A, be the winning profile.

The next profile, 900B, is selected to be the current profile in block 1040, and the comparison between values in the power cycle characteristics 400 and corresponding thresholds in profile 900B occurs in block 1020. In this example scenario, all thresholds in profile 900B are met, so block 1030 is executed. In this scenario, the current profile, 900B, is not a stronger indication than the winning profile, 900A: the number of transitions threshold 930B3 in the current profile 900B is 9, which is less than 10, the number of transitions threshold 930A3 in the winning profile 900A. Since the comparison failed, block 1040 is executed next and the winning profile remains the same.

The next profile, 900C, is selected to be the current profile in block 1040. The comparison between values in the power cycle characteristics 400 and corresponding thresholds in profile 900C occurs in block 1020. In this example scenario, all thresholds in profile 900C are not met: the number of transitions 340 in characteristics 400 is 10, which is less than 400, the number of transitions threshold 930C3 in the current profile 900C. Therefore, block 1040 is executed and the winning profile remains the same. Since the current profile 900C is the last profile, block 1050 is executed next and processing is complete.

In this scenario, the process of FIG. 10 has selected profile 900A as the "winning profile" and best match from all three profiles. The severity level 950 of winning profile 900A can then be used, as described earlier in connection with FIG. 9, to determine which notification mechanism is used. For example, the severity level 950 of winning profile 900A can be used by the notification logic 740 and 850 in the embodiments of FIGS. 7 and 8, respectively.

Any process descriptions or blocks in flowcharts should be understood as representing modules, segments, or portions of code which include one or more executable instructions for implementing specific logical functions or steps in the process. As would be understood by those of ordinary skill in the art of the software development, alternate implementations are also included within the scope of the disclosure. In these alternate implementations, functions may be executed out of order from that shown or discussed, including substantially concurrently or in reverse order, depending on the functionality involved.

The systems and methods disclosed herein can be embodied in any computer-readable medium for use by or in connection with an instruction execution system, apparatus, or device. Such instruction execution systems include any computer-based system, processor-containing system, or other system that can fetch and execute the instructions from the instruction execution system. In the context of this disclosure, a "computer-readable medium" can be any means that can contain, store, communicate, propagate, or transport the program for use by, or in connection with, the instruction execution system. The computer readable medium can be, for example but not limited to, a system or propagation medium that is based on electronic, magnetic, optical, electromagnetic, infrared, or semiconductor technology.

Specific examples of a computer-readable medium using electronic technology would include (but are not limited to) the following: an electrical connection (electronic) having one or more wires; a random access memory (RAM); a read-only memory (ROM); an erasable programmable read-only memory (EPROM or Flash memory). A specific example using magnetic technology includes (but is not limited to) a portable computer diskette. Specific examples using optical technology include (but are not limited to) an optical fiber and a portable compact disk read-only memory (CD-ROM).

The foregoing description has been presented for purposes of illustration and description. It is not intended to be exhaustive or to limit the disclosure to the precise forms disclosed. Obvious modifications or variations are possible in light of the above teachings. The implementations discussed, however, were chosen and described to illustrate the principles of the disclosure and its practical application to thereby enable one of ordinary skill in the art to utilize the disclosure in various implementations and with various modifications as are suited to the particular use contemplated. All such modifications and variation are within the scope of the disclosure as determined by the appended claims when interpreted in accordance with the breadth to which they are fairly and legally entitled.

What I claim is:

1. A method comprising:
   detecting a series of power cycle events, each power cycle event indicating a transition between line power and battery power;
   analyzing, by a computing device that includes at least one processor, the series of power cycle events to produce at least one power cycle characteristic;
   comparing the power cycle characteristic to at least one stored power cycle characteristic profile, which includes an average frequency of transitions to battery characteristic, an average interval between transitions to battery characteristic, and a total number of transitions to battery characteristic; and
   storing in memory an indication of detrimental battery operation if the comparison is a match, wherein a determination is made whether to notify an individual of the detrimental battery operation based on settings provided by the individual, and wherein an e-mail notification is provided to the individual to identify the detrimental battery operation.

2. The method of 1, wherein the at least one power cycle characteristic comprises a frequency of power cycle events, a duration of a battery power interval, a total number of power cycle events, and a variation in the frequency of power cycle events.

3. The method of 1, further comprising the step of:
   notifying a user of the device, through a telephone call, of the indication of detrimental battery operation.

4. The method of 1, further comprising the steps of:
   receiving a power cycle characteristics profile; and
   storing the power cycle characteristics profile.

5. The method of 1, further comprising the steps of:
   creating the power cycle characteristics profile based on a description of the profile.

6. A method comprising:
   detecting a series of power cycle events, each power cycle event indicating a transition between line power and battery power;
   analyzing, by a computing device that includes at least one processor, the series of power cycle events to produce at least one power cycle characteristic;
   comparing the power cycle characteristic to at least one stored power cycle characteristic profile, which includes an average frequency of transitions to battery characteristic, an average interval between transitions to battery characteristic, and a total number of transitions to battery characteristic; and
   producing an indication of detrimental battery operation if the comparison is a match, wherein a determination is made whether to notify an individual of the detrimental battery operation based on settings provided by the individual, and wherein an e-mail notification is provided to the individual to identify the detrimental battery operation.

7. The method of claim 6, wherein the at least one power cycle characteristic comprises a frequency of power cycle events, a duration of a battery power interval, a total number of power cycle events, and a variation in the frequency of power cycle events.

8. The method of claim 6, further comprising the step of:
   notifying a user of the device of the indication of detrimental battery operation.

9. The method of claim 6, further comprising the step of:
   notifying a user of the device, through a telephone call, of the indication of detrimental battery operation.

10. The method of claim 6, further comprising the steps of:
    receiving a power cycle characteristics profile; and
    storing the power cycle characteristics profile.

11. The method of claim 6, further comprising the steps of:
    creating the power cycle characteristics profile based on a description of the profile.

12. The method of claim 6, further comprising the step of storing an indication of detrimental battery operation if the comparison is a match.

* * * * *